United States Patent [19]
Beise

[11] Patent Number: 5,761,035
[45] Date of Patent: Jun. 2, 1998

[54] CIRCUIT BOARD APPARATUS AND METHOD FOR SPRAY-COOLING A CIRCUIT BOARD

[75] Inventor: Thomas R. Beise, Hoffman Estates, Ill.

[73] Assignee: Motorola, Inc., Schaumburg, Ill.

[21] Appl. No.: 674,773

[22] Filed: Jun. 28, 1996

[51] Int. Cl.$^6$ ........................................ H05K 7/20
[52] U.S. Cl. ..................... 361/699; 165/80.4; 257/714; 174/15.1
[58] Field of Search ................ 62/64, 259.2; 165/80.4, 165/104.33; 174/15.1; 257/714, 715; 361/688–689, 699, 704, 707, 715, 719–721

[56] References Cited

U.S. PATENT DOCUMENTS

| 3,648,113 | 3/1972 | Rathjen et al. ................... 361/689 |
| 4,897,762 | 1/1990 | Daikoku et al. ................... 361/689 |
| 4,912,600 | 3/1990 | Jaeger et al. ..................... 361/699 |
| 4,964,019 | 10/1990 | Belanger, Jr. . |
| 5,220,804 | 6/1993 | Tilton et al. . |

FOREIGN PATENT DOCUMENTS 0091733  10/1983  European Pat. Off. ............... 361/699

Primary Examiner—Gregory D. Thompson
Attorney, Agent, or Firm—Heather L. Creps

[57] ABSTRACT

The circuit board apparatus (10) includes a first layer (12, 14), a second layer (12, 14) and an inner plate (19) disposed between the first layer (12, 14) and the second layer (12, 14). A fluid distributing conduit (38) is disposed in the inner plate (19). The fluid distributing conduit (38) has a first end (22), a central portion (24) defining a chamber, and a second end (26). A first electronic component (28) is disposed within the chamber (24). A nozzle (60) is disposed in the fluid distributing conduit (38). The nozzle (60) receives a fluid, atomizes the fluid and discharges the atomized fluid (70) into the chamber (24).

27 Claims, 2 Drawing Sheets

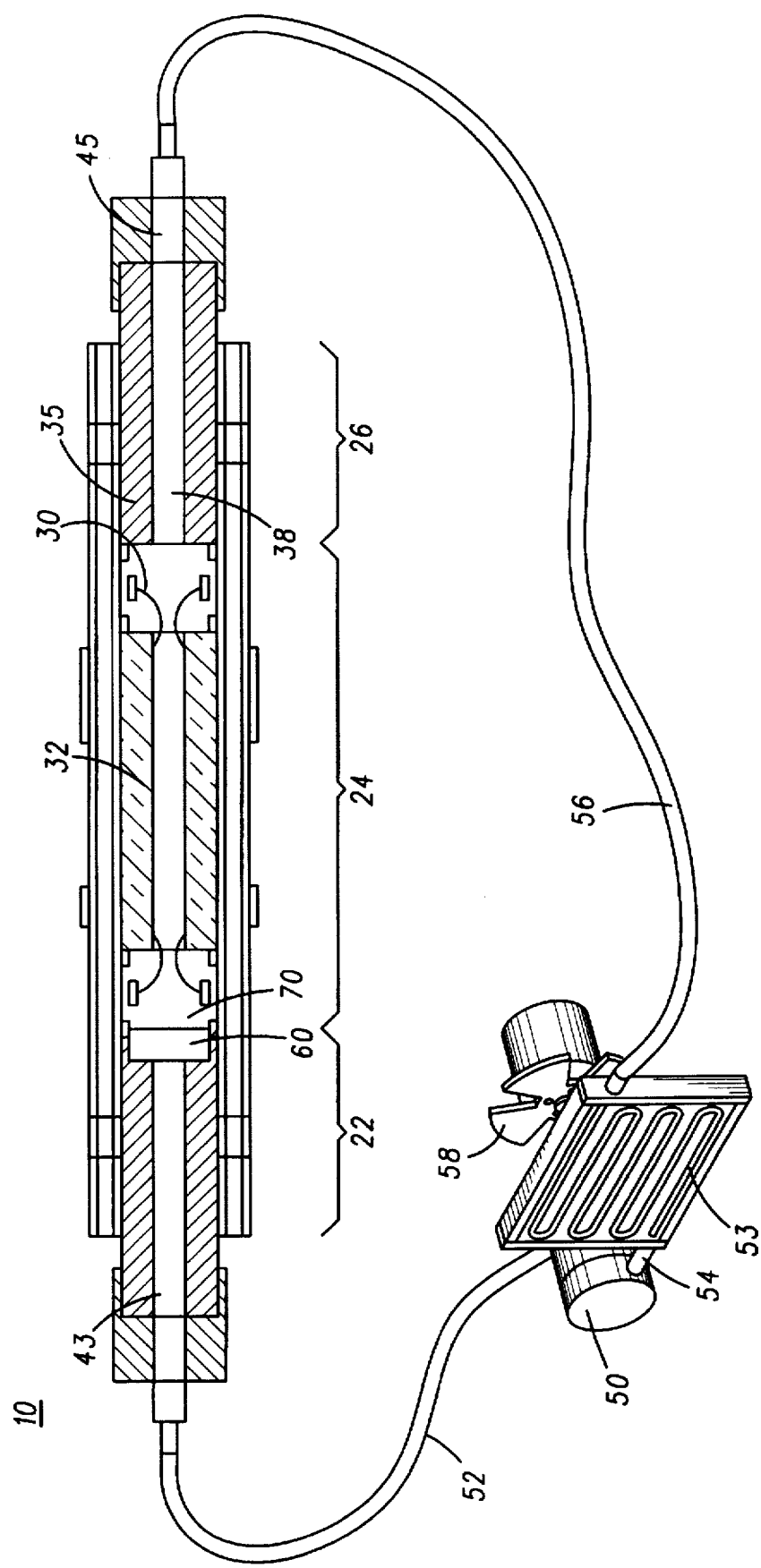

5,761,035

CIRCUIT BOARD APPARATUS AND METHOD FOR SPRAY-COOLING A CIRCUIT BOARD

FIELD OF THE INVENTION

This invention relates generally to cooling for electronic modules, and, more particularly, to a circuit board apparatus and a method for spray-cooling a circuit board.

BACKGROUND OF THE INVENTION

Electronic modules such as printed circuit boards (PCBs), multi-chip modules (MCMs) and electronic hybrid assemblies generally include a number of individual electronic components such as integrated circuits, passive components and power transistors. The individual electronic components may be heat sources which require cooling during normal operation.

Often, electronic components are cooled by natural or forced air convection which, because of the relatively poor thermal capacitance and heat transfer coefficients of air, requires moving large volumes of air past the components or past heavy heat sinks attached to the components. The air cooling process also suffers from several other disadvantages. For example, the air cooling process may not provide uniform cooling for each heat-producing electronic component within an electronic module, it may result in undesirably large product packaging, and it may introduce undesired acoustic noise or contaminants, such as dust, onto the components.

Evaporative spray cooling features the spraying of atomized fluid droplets directly or indirectly onto a surface of a heat source such as an electronic component. When the fluid droplets impinge upon the component's surface, a thin film of liquid coats the component, and heat is removed primarily by evaporation of the fluid from the component's surface.

Although evaporative spray cooling is a preferred method of heat removal in many electronics applications, known spray cooling systems are generally designed to spray-cool entire surfaces of electronic modules such as printed circuit boards. Thus, a spray-cooling system may increase circuit board packaging size. In addition, extensive sealing may be required prior to operation of the spray-cooling system.

There is therefore a need for a compact, self-sealing circuit board apparatus which would facilitate the spray-cooling of an electronic component, and a method for spray-cooling the electronic component within the circuit board apparatus.

SUMMARY OF THE INVENTION

According to an aspect of the present invention, the foregoing needs are addressed by a circuit board apparatus including a first layer, a second layer and an inner plate disposed between the first layer and the second layer. The inner plate has a fluid distributing conduit disposed therein. The fluid distributing conduit has a first end, a central portion defining a chamber, and a second end. A first electronic component is disposed within the chamber. A nozzle is disposed in the fluid distributing conduit, the nozzle receiving a fluid, atomizing the fluid and discharging the atomized fluid into the chamber.

According to another aspect of the present invention, a circuit board apparatus includes a first layer having a first side and a second side, a second layer having a first side and a second side and an inner plate disposed between the first layer and the second layer. The inner plate has a fluid distributing conduit disposed therein, the fluid distributing conduit having a first end, a central portion defining a chamber and a second end. An electronic component is disposed in the chamber. A nozzle housing which is sized to receive a nozzle is disposed in the fluid distributing conduit.

According to a further aspect of the present invention, a method for spray-cooling a circuit board includes providing a first layer and a second layer; disposing an inner plate between the first layer and the second layer, the inner plate having a fluid distributing conduit disposed therein, the fluid distributing conduit having a central portion defining a chamber, an electronic component disposed in the chamber; and receiving a fluid by a nozzle disposed in the fluid distributing conduit, the nozzle atomizing the fluid and discharging the atomized fluid into the chamber.

Advantages of the present invention will become readily apparent to those skilled in the art from the following description of the preferred embodiment(s) of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

BRIEF DESCRIPTION OF THE DRAWINGS

FIG. 4 illustrates a closed-loop fluid flow for the circuit board apparatus shown in FIG. 1.

DETAILED DESCRIPTION OF THE PREFERRED EMBODIMENTS

Figure 1:
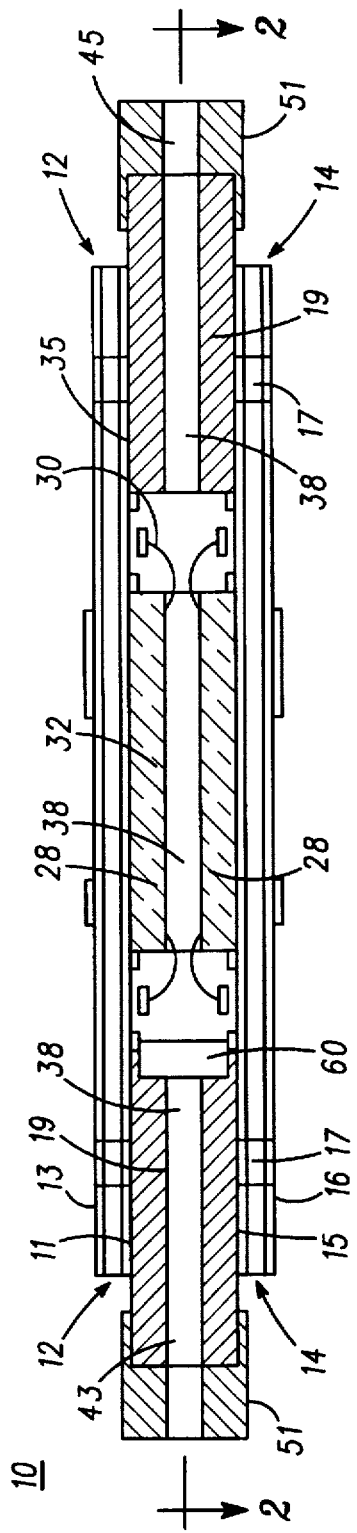
FIG. 1 is a side view of a circuit board apparatus according to a preferred embodiment of the present invention.

Turning now to the drawings, wherein like numerals designate like components, FIG. 1 is a side view of a circuit board apparatus 10 according to a preferred embodiment of the present invention. Apparatus 10 includes a first layer 12, a second layer 14 and an inner plate 19. Layers 12, 14 are preferably high-temperature epoxy laminates, but may be any suitable circuit board-type material, such materials being well-known and widely available. Inner plate 19 is preferably composed of aluminum core-board, but also may be any suitable material, such as another metal or plastic. First layer 12 has a first side 11 and a second side 13, preferably made of copper or another metal. Likewise, second layer 14 has a first side 15 and a second side 16, also preferably copper.

Inner plate 19 may be attached to first sides 11, 15, respectively, via an adhesive material 35, for example, an epoxy bond material such as a prepeg adhesive or a thermally-conductive adhesive, available from a variety of commonly known sources.

Figure 2:
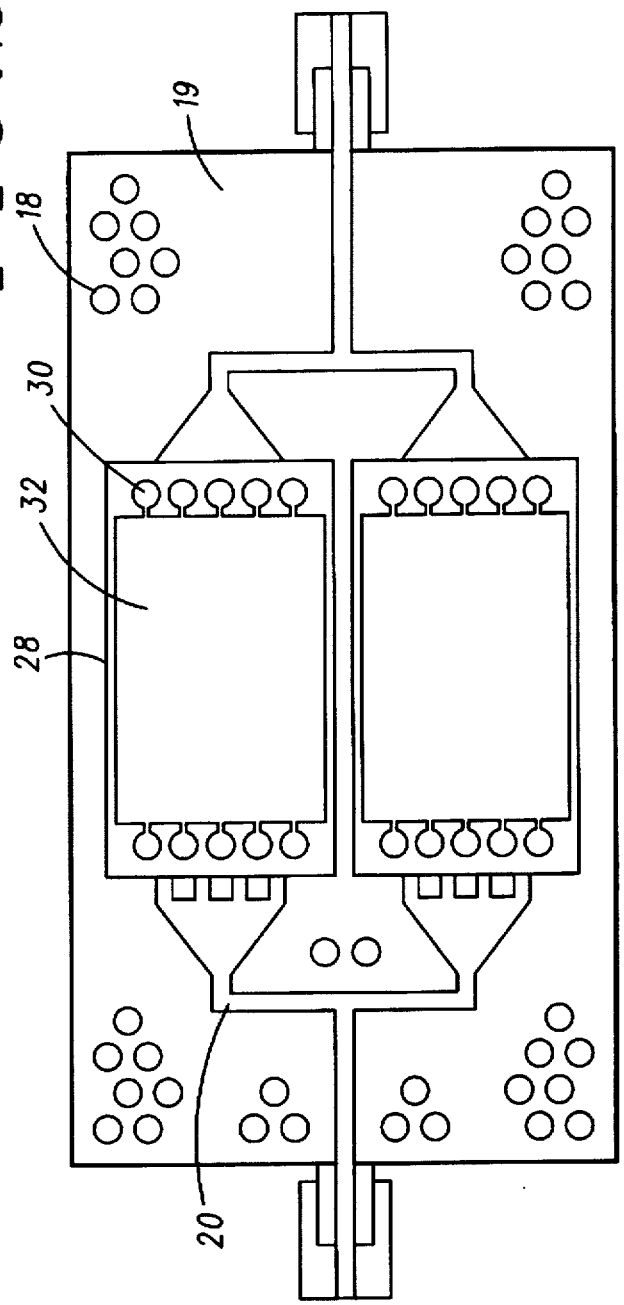
FIG. 2 is a top view along line 2—2 of the circuit board apparatus depicted in FIG. 1.

When first layer 12 is removed, as depicted in FIG. 2, it can be seen that inner plate 19 has a number of perforations 18 therein. Perforations 18 collect adhesive material 35, helping to bond inner plate 19 to first sides 11, 15, respectively.

As further shown in FIG. 2, inner plate 19 includes at least one fluid distributing conduit 20. As shown, fluid distributing conduit 20 has multiple interconnected branches. Conduit 20 may be formed integrally within plate 19 using well-known techniques for processing circuit boards. Alternatively, plate 19 may be formed from two parts which, when mated, form fluid distributing conduit 20. Conduit 20 may be formed in any desired configuration, and each branch may have a cross-sectional shape which is conical, cylindrical, rectangular or of another suitable shape. As illustrated in FIG. 1, fluid distributing conduit 38 may be referred to as having a first end 22, a second end 26 and a central portion 24, central portion 24 defining a chamber.

Referring to both FIGS. 1 and 2, electronic components 28, which may be, for example, NPN Silicon Radio Frequency (RF) Power Transistors, available from Motorola, order number MRF899/D, are mounted within chamber 24 and may include terminals 30 and one or more dies 32. Electronic components 28 may be disposed within chamber 24 and attached to first side 11 of first layer 12 and also to first side 15 of second layer 14 using traditional techniques, for example, by wirebonding. References to electronic components 28 will be understood to apply not only to power transistors, but also to other electronic components, including but not limited to passive components and integrated circuits.

Via holes 17 extending through first layer 12 and second layer 14 allow electronic components 28 to be electronically connected to both sides 11, 13 of first layer 12 and to both sides 15, 16 of second layer 14. In addition, either second side 13 of first layer 12 or second side 16 of second layer 14 may be attached to a main system board (not shown). Attachment to the main system board may be accomplished in a variety of well-known ways, using solder bumps, for example.

A fluid inlet port 43, which is preferably a portion of inner plate 19, but which may be formed from another material altogether, extends from apparatus 10, and a device such as a plastic or metal tube may be coupled to fluid inlet port 43 using a connector 51 such as a barbed fitting. A similarly-constructed fluid outlet port 45 may extend from layers 12, 14 at second end 26, and may also be fitted with a plastic or metal tube held in place by connector 51.

Figure 3:
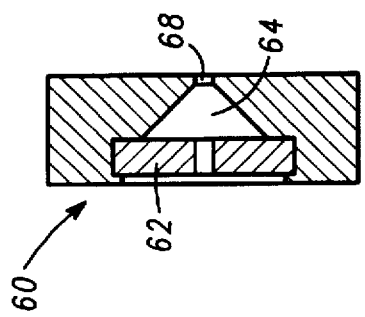
FIG. 3 is a cross-sectional view of a nozzle for use in the circuit board apparatus depicted in FIG. 1.

At least one nozzle 60, or nozzle housing 61 (shown in FIG. 3) sized to receive nozzle 60, shown in FIG. 1, is disposed in at least one branch of fluid distributing conduit 38. FIG. 3 is a cross-sectional view of nozzle 60. Nozzle 60 has a receptacle end 62 which is perpendicular to fluid distributing conduit 38, and which includes a swirl plate or insert. The swirl plate may be secured to receptacle end 62 by, for example, press-fitting, soldering or bonding. A spray end 64 includes an aperture 68, which is preferably on the order of 0.15 mm in diameter. It will be appreciated that nozzle 60, along with swirl plate 600 may be integrally formed in fluid distributing conduit 38.

Nozzle 60 is preferably a miniature atomizer such as a simplex pressure-swirl atomizer, which is approximately 1.5 mm high, and may be made of any suitable material. An example of a suitable material is a metal such as brass or stainless steel. Simplex pressure-swirl atomizers are described in detail in U.S. Pat. No. 5,220,804 to Tilton et al., incorporated herein by reference, and are commercially available from Isothermal Systems Research, Inc., located in Colton, Wash.

FIG. 4 illustrates the use of spray-cooling techniques, including a closed-loop fluid supply system, in conjunction with circuit board apparatus 10. A fluid pump 50, which is connected via tube 52 to fluid inlet port 43, supplies a coolant fluid to nozzle 60, which is disposed within fluid distributing conduit 38. Nozzle 60 atomizes the coolant and discharges an atomized fluid 70 through aperture 68 into chamber 24 and onto one or more dies 32 and terminals 30. When atomized fluid 70 impinges upon the surfaces of dies 32, a thin liquid film coats dies 32, and heat is removed primarily by evaporation of fluid 70 from dies 32. Excess fluid is collected at second end 26 of fluid distributing conduit 38 and removed via fluid outlet port 45.

The coolant fluid may be any dielectric coolant, such coolants being well-known and widely available. One example of a suitable coolant is 3M's Fluorinert™ dielectric fluid, available from 3M, order number FC-72. Another perfluorocarbon fluid similar to 3M's Fluorinert™ dielectric fluid is available from Ausimont Galden®.

A condenser 53, connected to pump 50 by tube 54 and to fluid outlet port 48 by tube 56, receives fluid from fluid outlet port 45. Condenser 53 rejects heat from the fluid, returning it to primarily a liquid phase. Fan 58 may be used to extend the cooling capacity of condenser 53. Cooled fluid is supplied from condenser 53 to pump 50. Thus, a closed-loop flow of coolant is formed. It will be appreciated that at any given point the coolant may be a vapor, a liquid or a vapor and liquid mixture.

It is contemplated that any conventional means for providing flow of a coolant may be used in conjunction with the described embodiments of the present invention, and that more than one circuit board apparatus 10 may be connected to a single source of coolant or that one or more sources of coolant may be connected to a single circuit board apparatus 10, for example, for redundancy purposes.

Sizes of fluid pump 50, condenser 53 and fan 58 should be selected based on heat removal and flow rate requirements. For example, a typical closed-loop fluid flow is 500 to 1000 milliliters per minute for 500 to 1000 Watts of heat dissipation. Pump and condenser assemblies in various sizes are available from Isothermal Systems Research, Inc., and acceptable tubing and fittings may be obtained from Cole-Parmer in Vernon Hills, Ill.

An electronic component or a group of electronic components having a power density of up to 300 Watts per square centimeter is effectively cooled using the disclosed apparatus. The removal of heat directly from individual electronic components, or from groups of electronic components, helps to reduce operating temperatures of the components, increasing reliability through reduction of thermal variation and associated thermal stresses.

Apparatus 10 may be extremely compact, because spacing is not governed by air volume requirements. Thus, packaging size for the entire electronic module may be reduced. In addition, unlike air cooling, which is most effective when heat is spread over a large area, for example, over a large heat sink, spray-cooling encourages heat concentration, another factor contributing to reduced packaging volume and weight.

Apparatus 10 allows a single printed circuit board to utilize one or more layers as a dispersion manifold for a cooling fluid, and allows critical thermal loads to be spray-cooled in a minimal volume of space. It will be appreciated that multiple circuit boards may be stacked and interconneted, for example, using conductive adhesive, to create a three-dimensional circuit board block.

Selectively utilizing apparatus 10 for specific electronic components, which may be isolated spots of high heat-load in otherwise low heat-load areas of an electronic module, may help to reduce surface area on a crowded electronic module that is devoted to mounting a spray-cooling system.

Thus, electronic module sizes should not increase because of the spray-cooling system.

The apparatus and method described herein results in a hermetically sealed electronic component, so that, for example, an electronic module may be designed which has one side devoted to test fixtures and to electronic devices that do not require spray-cooling, and another side devoted to high heat-dissipating, spray-cooled electronic components enclosed in circuit board apparatuses 10. Then, the electronic module may be tested and spray-cooled simultaneously.

It should be appreciated that the present invention is not limited to cooling a specific electronic component, but may be adapted to cool any heat source, for example, a heat sink or flange. Likewise, the present invention is not limited to printed circuit boards. Other electronic modules, such as multi-chip modules (MCMs) and electronic hybrid assemblies, may be substituted for printed circuit boards.

It is further contemplated that wherever sealing and/or fastening may be required, numerous methods and materials may be used. For example, fasteners such as screws, compliant gaskets, ultrasonic welding, brazing, soldering or swaging may be utilized.

It will be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

We claim:

1. A circuit board apparatus, comprising:
    a first layer;
    a second layer;
    an inner plate disposed between the first layer and the second layer, the inner plate having a fluid distributing conduit disposed therein, the fluid distributing conduit having a first end, a central portion defining a chamber, and a second end;
    a first electronic component disposed within the chamber; and
    a nozzle disposed in the fluid distributing conduit, the nozzle receiving a fluid, atomizing the fluid and discharging the atomized fluid into the chamber.

2. The apparatus according to claim 1, wherein the first electronic component is selected from the group consisting essentially of: a power transistor, a passive component, and an integrated circuit.

3. The apparatus according to claim 1, wherein the nozzle comprises brass.

4. The apparatus according to claim 1, further comprising:
    a second electronic component disposed in the chamber.

5. The apparatus according to claim 4, wherein the nozzle discharges the atomized fluid onto the second electronic component.

6. The apparatus according to claim 1, wherein the first layer and the second layer comprise high temperature epoxy laminates.

7. The apparatus according to claim 1, wherein the first layer has a first side and a second side, and wherein the second layer has a first side and a second side.

8. The apparatus according to claim 7, wherein a conductive adhesive couples the first side of the first layer to the inner plate.

9. The apparatus according to claim 7, wherein the first electronic component is attached to the first side of the first layer.

10. The apparatus according to claim 7, wherein the first side of the first layer and the first side of the second layer comprise copper.

11. The apparatus according to claim 1, wherein the fluid distributing conduit has a cross-sectional shape selected from the group consisting essentially of: conical, rectangular and circular.

12. The apparatus according to claim 1, wherein the fluid comprises a dielectric fluid.

13. The apparatus according to claim 8, wherein the dielectric fluid comprises Fluorinert™.

14. The apparatus according to claim 1, further comprising:
    a fluid inlet port in communication with the first end of the fluid distributing conduit.

15. The apparatus according to claim 14, further comprising:
    a fluid outlet port in communication with the second end of the fluid distributing conduit.

16. The apparatus according to claim 15, further comprising:
    a fluid pump in communication with the fluid inlet port; and
    a condenser in communication with the fluid pump and with the fluid outlet port,
    the condenser receiving the fluid from the fluid outlet port and supplying the fluid to the fluid inlet port, forming a closed loop fluid flow.

17. A circuit board apparatus, comprising:
    a first layer having a first side and a second side;
    a second layer having a first side and a second side;
    an inner plate disposed between the first layer and the second layer and having a fluid distributing conduit therein, the fluid distributing conduit having a first end, a central portion defining a chamber and a second end;
    an electronic component disposed in the chamber; and
    a nozzle housing disposed in the fluid distributing conduit, the nozzle housing sized to receive a nozzle.

18. A method for spray-cooling an electronic component disposed in a multi-layer circuit board, comprising:
    providing a first circuit board layer and a second circuit board layer;
    disposing an inner plate between the first layer and the second layer, the inner plate having a fluid distributing conduit disposed therein, the fluid distributing conduit having a central portion defining a chamber, the electronic component disposed in the chamber; and
    receiving a fluid by a nozzle disposed in the fluid distributing conduit, the nozzle atomizing the fluid and discharging the atomized fluid into the chamber.

19. The apparatus according to claim 17, wherein the electronic component is selected from the group consisting of: a power transistor, a passive component, and an integrated circuit.

20. The apparatus according to claim 17, wherein the first layer and the second layer comprise high temperature epoxy laminates.

21. The apparatus according to claim 17, wherein the first layer has a first side and a second side, and wherein the second layer has a first side and a second side.

22. The apparatus according to claim 21, wherein a conductive adhesive couples the first side of the first layer to the inner plate.

23. The apparatus according to claim 21, wherein the first electronic component is attached to the first side of the first layer.

24. The apparatus according to claim 21, wherein the first side of the first layer and the first side of the second layer comprise copper.

25. The apparatus according to claim 17, wherein the fluid distributing conduit has a cross-sectional shape selected from the group consisting of: conical, rectangular and circular.

26. The apparatus according to claim 17, further comprising:

a fluid inlet port in communication with the first end of the fluid distributing conduit.

27. The apparatus according to claim 26, further comprising:

a fluid outlet port in communication with the second end of the fluid distributing conduit.

* * * * *